US007680557B2

(12) United States Patent
Kim et al.

(10) Patent No.: US 7,680,557 B2
(45) Date of Patent: Mar. 16, 2010

(54) SYSTEM FOR PROCESSING SEMICONDUCTOR SUBSTRATE BY USING LASER AND METHOD OF THE SAME

(75) Inventors: Dae-Jin Kim, Suwon (KR); Je-Kil Ryu, Suwon (KR); Hyun-Jung Kim, Suwon (KR)

(73) Assignee: Hantech Co., Ltd., Yongin-si, Gyeonggi-do (KR)

( * ) Notice: Subject to any disclaimer, the term of this patent is extended or adjusted under 35 U.S.C. 154(b) by 467 days.

(21) Appl. No.: 11/575,706

(22) PCT Filed: Sep. 22, 2004

(86) PCT No.: PCT/KR2004/002427

§ 371 (c)(1),
(2), (4) Date: Mar. 21, 2007

(87) PCT Pub. No.: WO2006/033489

PCT Pub. Date: Mar. 30, 2006

(65) Prior Publication Data
US 2008/0015728 A1 Jan. 17, 2008

(51) Int. Cl.
*G06F 19/00* (2006.01)
(52) U.S. Cl. ...................... 700/121; 700/166
(58) Field of Classification Search ............ 700/121, 700/166
See application file for complete search history.

(56) References Cited

U.S. PATENT DOCUMENTS 7,043,330 B2 * 5/2006 Toyserkani et al. ......... 700/166
2005/0244047 A1 * 11/2005 Kern et al. ................. 382/141

FOREIGN PATENT DOCUMENTS

| JP | 06-260545 | 9/1994 |
| JP | 07-201688 | 8/1995 |
| JP | 11-354398 | 12/1999 |
| KR | 10-227421 B1 * | 8/1999 |
| KR | 10-2004-0069821 | 8/2004 |

* cited by examiner

Primary Examiner—Ryan A Jarrett
(74) Attorney, Agent, or Firm—Ladas & Parry LLP

(57) ABSTRACT

The present invention provides a system for processing a semiconductor substrate using a laser beam, the system including: a storing unit storing a process control data set for a slot for loading the semiconductor substrate therein; a process controlling unit detecting identification information of the slot in which the semiconductor substrate is loaded, and reading the control data, which is set for the detected identification information, from the storing unit to control a process of the semiconductor substrate; and a substrate processing unit processing the semiconductor substrate on the basis of the read control data using the laser beam with a predetermined energy.

30 Claims, 5 Drawing Sheets

SYSTEM FOR PROCESSING SEMICONDUCTOR SUBSTRATE BY USING LASER AND METHOD OF THE SAME

TECHNICAL FIELD

The present invention relates to a system and method for processing a semiconductor substrate using a laser, by which a variety of semiconductor substrates can be processed using only one piece of equipment.

BACKGROUND ART

A semiconductor substrate is manufactured using processes such as oxidation, exposure, development, etching, ion-implantation, planarization, deposition, metallization and the like. Further, each of these processes includes operations of stripping, polishing, cleaning, annealing, and the like. Besides these processes, another process is performed depending on the kind of a device formed in the semiconductor substrate and the material constituting the semiconductor substrate. Alternatively, the characteristic of laser, the scanning speed, and the kind of a gas injected into a chamber are different depending on each of the processes, the type of the device, and the substrate characteristic.

Due to the complicated processes of manufacturing the semiconductor substrate, a conventional semiconductor-manufacturing device processes the semiconductor substrate using only a predetermined process. Accordingly, the conventional semiconductor-manufacturing device should be reset when a new process has to be performed or when a semiconductor substrate with a different characteristic from a previously processed semiconductor substrate has to be processed. This results in a work complexity, and a process delay depending on the time taken for the reset.

DISCLOSURE OF THE INVENTION

The present invention provides a system and method for processing a semiconductor substrate using a laser by which a variety of semiconductor substrates with different characteristics can be processed using one apparatus to execute various manufacturing processes without the need for a separate manipulation.

According to an aspect of the present invention, there is provided a system for processing a semiconductor substrate using a laser beam, the system including: a storing unit storing a process control data set for a slot for loading the semiconductor substrate therein; a process controlling unit detecting identification information of the slot in which the semiconductor substrate is loaded, and reading the control data, which is set for the detected identification information, from the storing unit to control a process of the semiconductor substrate; and a substrate processing unit processing the semiconductor substrate on the basis of the read control data using the laser beam with a predetermined energy.

The process controlling unit may include: a detecting unit detecting the identification information assigned to the slot; and a controlling unit controlling the process of the semiconductor substrate by reading the control data from the storing unit.

The process controlling unit may further include a user interfacing unit receiving the identification information for the slot from a user.

The detecting unit may be provided at an aligner aligning the semiconductor substrates respectively loaded in the slots.

According to another aspect of the present invention, there is provided a system for processing a semiconductor substrate using a laser beam, the system including: a first storing unit storing a process control data set for the semiconductor substrate; a second storing unit storing image data of each of processes of the semiconductor substrate; a photographing unit photographing the semiconductor substrate to output a photographed image of the semiconductor substrate; a process controlling unit comparing the outputted photographed image and the stored image data to decide the process of the semiconductor substrate, and reading the control data corresponding to the decided process from the first storing unit to control the process of the semiconductor substrate; and a substrate processing unit processing the semiconductor substrate on the basis of the read control data using the laser beam with a predetermined energy.

The process controlling unit may include: a deciding unit comparing a pattern formed on the semiconductor substrate and a pattern of the stored image data on the basis of the photographed image to decide the process of the semiconductor substrate; and a controlling unit reading the control data corresponding to the decided process from the first storing unit, and controlling the process of the semiconductor substrate on the basis of the read control data.

The process controlling unit may further include a user interfacing unit receiving the stored control data or the stored image data from a user.

The photographing unit may be provided at an aligner aligning the semiconductor substrates loaded in a plurality of slots provided in a cassette.

The photographing unit may include a photoelectric conversion unit converting a light emitted from the semiconductor substrate into a predetermined electrical signal.

The control data may have at least one of a control parameter, a scanning speed, a repetition rate, an attenuation angle of the laser beam, a kind of a reactive gas, and an injection speed of the reactive gas, which correspond to the process of the semiconductor substrate.

The process of the semiconductor substrate may include a first process including at least one of etching, ion-implantation, planarization and deposition, and a second process including at least one of stripping, polishing, cleaning, and annealing corresponding to the first process.

The device may be at least one of a memory device, a nonmemory device, a RF (Radio Frequency) device, and a displaying device.

The substrate processing unit may include: a laser generating unit generating the laser beam; an optical unit transmitting the laser beam to the semiconductor substrate; a chuck loading the semiconductor substrate thereon; and a transferring unit transferring the semiconductor substrate from the cassette in which the semiconductor substrate is loaded, to the chuck.

The substrate processing unit may further include: a vacuum chamber providing a vacuum atmosphere or a gas atmosphere to process the semiconductor substrates loaded therein; a gas box storing a reactive gas or a purge gas, which is introduced into the vacuum chamber to provide the gas atmosphere; and a pumping system having a pumping line for exhausting an internal gas from the vacuum chamber.

The substrate processing unit may further include a stage driven by a driving motor, to allow the laser beam to be irradiated on an entire surface of the semiconductor substrate.

The substrate processing unit may further include the stage supporting a chuck, whereby the chuck supported by the stage is driven to allow the laser beam to be irradiated on the entire surface of the semiconductor substrate.

The optical unit may include: an attenuator controlling an amount of an energy of the laser beam outputted from the laser generating unit; a homogenizer regularizing an energy distribution of the laser beam; a lens array having a field lens and a doublet lens controlling the irradiated laser beam to have a regular beam profile; and a mirror changing a path of the laser beam to be irradiated on the semiconductor substrate.

The transferring unit may include: the cassette having the plurality of slots in which the semiconductor substrate are loaded; an aligner aligning the semiconductor substrate loaded in the slots of the cassette; a cooling stage cooling the heated semiconductor substrate; and a transferring robot transferring the loaded semiconductor substrate from the slots to the chuck of the chuck chamber.

The photographing unit may be provided at the transferring unit.

The laser generating unit may generate the laser beam having energy larger than energy necessary for removing particles from the semiconductor substrate.

According to a further another aspect of the present invention, there is provided a method for processing a semiconductor substrate using a laser beam, the method including: setting a process control data for a slot in which the semiconductor substrate is loaded; detecting identification information of the slot, and controlling a process of the semiconductor substrate on the basis of the set control data; and processing the semiconductor substrate on the basis of the control data using the laser beam with a predetermined energy.

The controlling of the process may include: detecting the identification information assigned to the slot; and controlling the process of the semiconductor substrate on the basis of the control data.

The detecting may be performed using an aligner aligning the semiconductor substrates respectively loaded in the slots.

According to a still another aspect of the present invention, there is provided a method for processing a semiconductor substrate using a laser beam, the method including: setting a process control data set for the semiconductor substrate; storing image data of each process of the semiconductor substrate; photographing the semiconductor substrate to output a photographed image; comparing the outputted photographed image and the stored image data to decide the process of the semiconductor substrate; controlling the process of the semiconductor substrate on the basis of the control data corresponding to the decided process; and processing the semiconductor substrate on the basis of the control data using the laser beam with a predetermined energy.

In the deciding of the process, a pattern formed on the semiconductor substrate may be compared with a pattern of the stored image data on the basis of the photographed image to decide the process of the semiconductor substrate.

The photographing may be performed using the photographing unit of the aligner aligning the semiconductor substrates, which are loaded in a plurality of slots provided in the cassette, or using the transferring unit transferring the semiconductor substrate.

The photographing may further include converting a light, which is emitted from the semiconductor substrate, into a predetermined electrical signal.

The control data may have at least one of a control parameter, a scanning speed, a repetition rate, an attenuation angle of the laser beam, a kind of a reactive gas, and an injection speed of the reactive gas, which correspond to the process of the semiconductor substrate.

The processing of the semiconductor substrate may include a first process including at least one of etching, ion-implantation, planarization, and deposition, and a second process including at least one of stripping, polishing, cleaning, and annealing, which correspond to the first process.

The control data may have at least one of the control parameter, the scanning speed, the repetition rate, the attenuation angle of the laser beam, the kind of the reactive gas, and the injection speed of the reactive gas, which correspond to a kind of a device formed in the semiconductor substrate or a kind of material constituting the semiconductor substrate.

The device may be at least one of a memory device, a nonmemory device, a RF (Radio Frequency) device and a displaying device.

The processing of the semiconductor substrate may include: transferring the semiconductor substrate from the cassette in which the semiconductor substrate is loaded to a heating chuck; and transmitting the generated laser beam from the laser generator to the semiconductor substrate.

The processing of the semiconductor substrate may further include preparing a vacuum atmosphere or a gas atmosphere to allow the loaded semiconductor substrates to be processed in the vacuum chamber.

The processing of the semiconductor substrate may further include driving the vacuum chamber into which the semiconductor substrate is introduced, to allow the laser beam to be irradiated on an entire surface of the semiconductor substrate.

The processing of the semiconductor substrate may further include driving the chuck on which the semiconductor substrate is loaded, to allow the laser beam to be irradiated on the entire surface of the semiconductor substrate.

The generated laser beam may have a larger energy than an energy necessary for removing particles from the semiconductor substrate.

Accordingly, various processes for manufacturing semiconductor substrates having different characteristics can be performed within one apparatus without a separate operation.

The present invention provides a contactless communication tag that prevents the reuse of or the fraudulent use of a genuine product tag in a counterfeit product without physically destroying the genuine product tag, is attached to a branded product, encrypts information of the branded product, and provides the encrypted information.

The present invention also provides a portable tag reader that is handy to carry and determines the genuineness of a product by decrypting information received from a contactless communication tag and outputting the decrypted information.

The present invention also provides a method of providing genuineness information of a product, in which information about the genuineness of the product is provided to a user by decrypting information stored in a tag and outputting the decrypted information.

According to one aspect of the present invention, there is provided a contactless communication tag that is attached to a product and provides product information. The contactless communication tag includes a contactless communication unit, which wirelessly exchanges data with a tag reader, creates a power source from a power signal received from the tag reader, and supplies the power source, a storing unit in which the product information and encryption key related information are stored, and an encryption unit, which encrypts the product information to be transmitted to the tag reader based on the encryption key related information.

According to another aspect of the present invention, there is provided a contactless communication tag that is attached to a product and provides product information. The contactless communication tag includes a contactless communication unit, which wirelessly exchanges data with a tag reader, creates a power source from a power signal received from the tag reader, and supplies the power source, a storing unit in which the product information, encryption key related information, and the number of times the product information is read by the tag reader, an encryption unit, which encrypts the product information to be transmitted to the tag reader based on the encryption key related information, and an information providing unit, which reads the product information stored in the storing unit in response to a product information request message received from the tag reader, provides the read product information to the encryption unit, and rejects provision of the product information if the number of times the product information is read exceeds a predetermined reference value.

According to still another aspect of the present invention, there is provided a portable tag reader that reads information received from a contactless communication tag. The portable tag reader includes a wireless communication unit, which wirelessly exchange data with the contactless communication tag and wirelessly sends a power required for the contactless communication tag, a storing unit in which at least one encryption key related information is stored, a decryption unit, which decrypts data received from the contactless communication tag based on encryption key related information that is selected from the encryption key related information by encryption key specifying information received from the contactless communication tag, an information reading unit, which requests product information to the contactless communication tag attached to a product and reads the product information received from the contactless communication tag, and an output unit, which outputs the read product information.

According to still another aspect of the present invention, there is provided a method of providing product information using a tag reader that communicates with a contactless communication tag attached to a product. The method involves receiving encryption key specifying information from the contactless communication tag, selecting encryption key related information corresponding to the received encryption key specifying information from encryption key related information stored in a storing means included in the tag reader, transmitting an information request message that requests the product information to the contactless communication tag, reading the product information received from the contactless communication tag based on the selected encryption key related information, and outputting a result of reading concerning the product information.

According to still another aspect of the present invention, there is provided a product to which a contactless communication tag is attached. The contactless communication tag in which product information is stored, wherein the contactless communication tag includes a contactless communication unit, which wirelessly exchanges data with a tag reader, creates a power source from a power signal received from the tag reader, and supplies the created power source, a storing unit in which product information including genuineness information of the product and encryption key related information are stored, an encryption unit, which encrypts a signal to be transmitted to the tag reader, and an information providing unit, which reads the product information stored in the storing unit in response to a product information request message received from the tag reader and provides the read product information to the encryption unit, wherein visible information corresponding to genuineness information of the product stored in the contactless communication tag is printed on or attached to the product.

BEST MODE FOR CARRYING OUT THE INVENTION

The present invention will now be described more fully with reference to the accompanying drawings, in which exemplary embodiments of the invention are shown.

Figure 1:
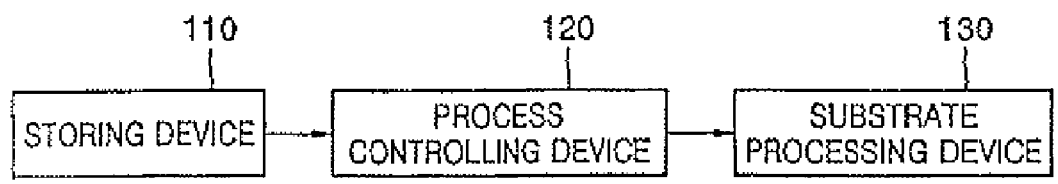
FIG. 1 is a block diagram illustrating a construction of a system for processing a semiconductor substrate using a laser, according to an embodiment of the present invention.

FIG. 1 is a block diagram illustrating a construction of a system for processing a semiconductor substrate by using a laser, according to an embodiment of the present invention.

Referring to FIG. 1, the system includes a storing device 110, a process controlling device 120, and a substrate processing device 130.

The storing device 110 stores a process control data set for a slot for loading the semiconductor substrate therein to allow the processing of the semiconductor substrate. The storing device 110 can be provided in the process controlling device 120. The process of the semiconductor substrate includes upper processes of etching, ion-implantation, planarization, deposition and the like. Each of the upper processes includes lower processes of stripping, polishing, cleaning, annealing, and the like. The control data is stored in the storing device 110 to determine a control parameter, a scanning speed, a repetition rate, an attenuation angle of a laser beam, a kind of a reactive gas, an injection speed of the reactive gas and the like, which are employed in each of the upper processes and the lower processes.

Figure 2:
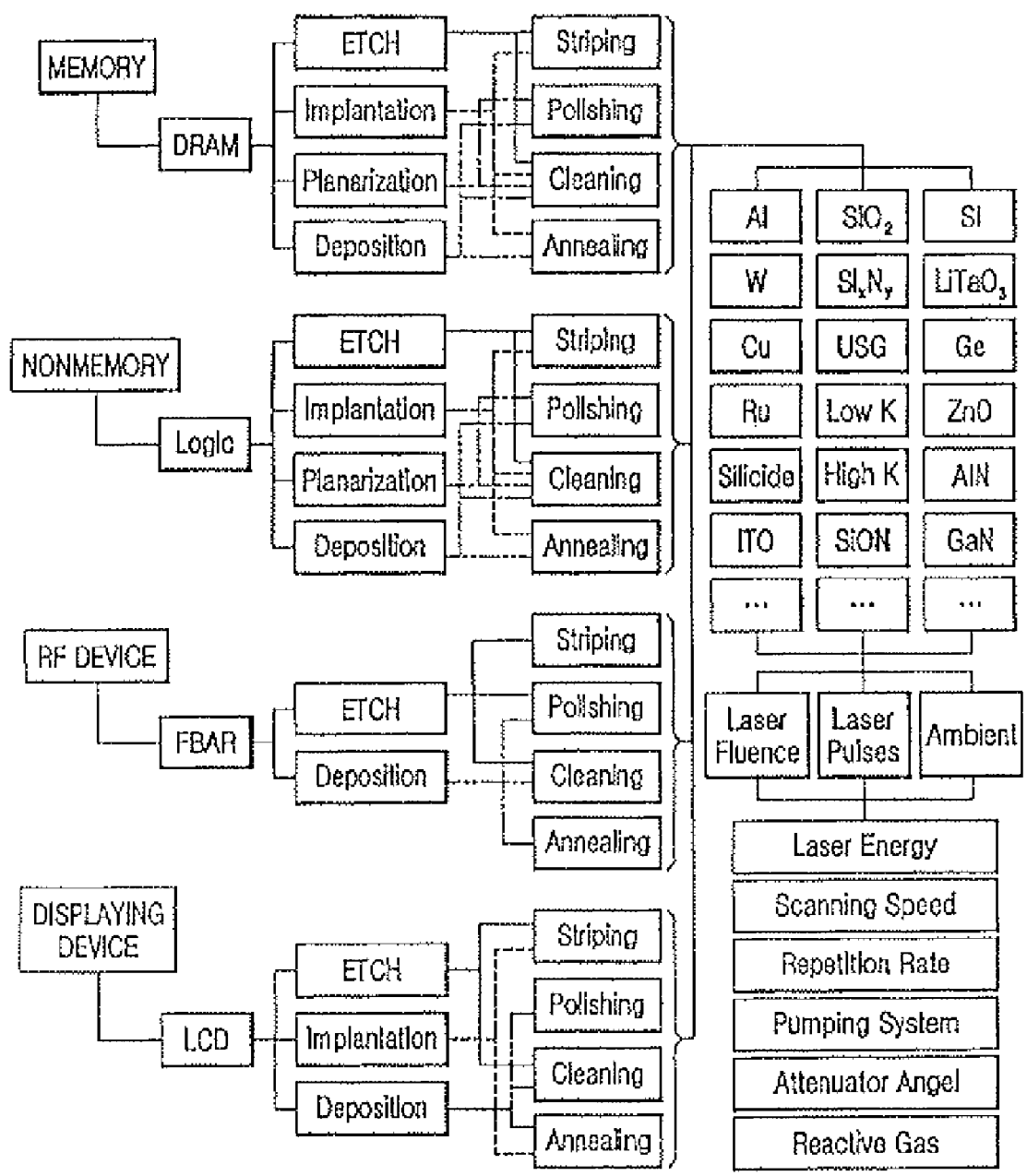
FIG. 2 is a view illustrating a DataBase (DB) structure of control data stored in a storing device, according to an embodiment of the present invention.

Alternatively, the storing device 110 can store the control data for determining the control parameter, the scanning speed, the repetition rate, the attenuation angle of the laser beam, the kind of the reactive gas, the injection speed of the reactive gas and the like, which depend on a kind of a device formed through each of the upper processes and the lower processes in the semiconductor substrate and a kind of a material constituting the semiconductor substrate. At this time, the device formed in the semiconductor substrate can be a memory device, a non-memory device, a Radio Frequency (RF) device, a display device and the like. The material constituting the semiconductor substrate can be aluminum (Al), silicon oxide ($SiO_2$), silicon (Si), and the like. FIG. 2 illustrates a DataBase (DB) structure of the control data stored in the storing device 110.

Figure 3:
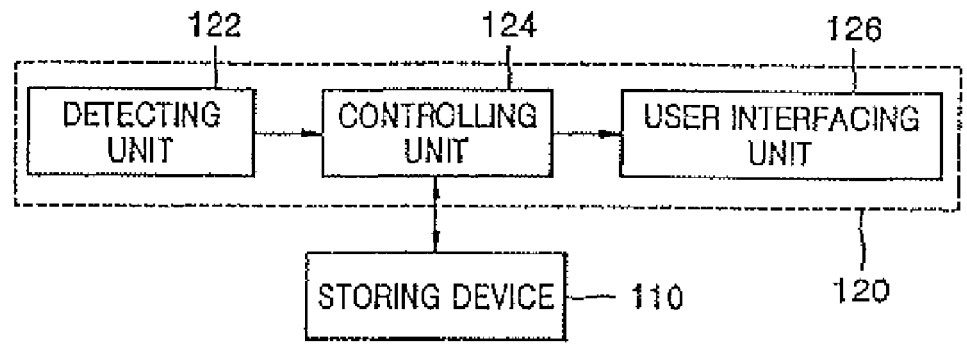
FIG. 3 is a view illustrating a construction of a process controlling device according to an embodiment of the present invention.

The process controlling device 120 detects identification information of the slot, and reads from the storing device 110 the control data, which is set for the detected identification information, to control the process of the semiconductor substrate. FIG. 3 illustrates a construction of the process controlling device 120 according to an embodiment of the present invention.

Referring to FIG. 3, the process controlling device 120 includes a detecting unit 122, a controlling unit 124, and a user interfacing unit 126. The detecting unit 122 detects the identification information assigned to the slot for loading the semiconductor substrate therein. The semiconductor substrate is loaded and transferred to the slot provided in a cassette. Proper identification information is assigned to each of the slots. The detecting unit 122 is provided at a transferring device for transferring the semiconductor substrate or an aligner for aligning the semiconductor substrate loaded in the slot. The detecting unit 122 transmits the detected identification information to the controlling unit 124 before the semiconductor substrate is detached from the slot and processed.

The controlling unit 124 reads the control data set for the detected identification information from the storing device 110, to control the process of the semiconductor substrate. A control signal outputted from the controlling unit 124 is inputted to the substrate processing device 130.

The user interfacing unit 126 receives the stored control data or receives the process corresponding to each of the slots from a user. The controlling unit 124 stores the received control data or the process corresponding to each of the slots in the storing device 110.

In more detail, in an operation of the process controlling device 120, the process controlling device 120 transmits a process commencing command for a specific slot to the substrate processing device 130 to control the process. For example, when a Dynamic Random Access Memory (DRAM) is formed using a semiconductor substrate loaded in a first slot of the cassette, the semiconductor substrate is formed of aluminum (Al), and the process is stripping or etching, the following procedure is performed. If the detecting unit 122 detects the identification information of the first slot, the controlling unit 124 controls the substrate processing unit 130 on the basis of the control data set for the first slot to process the semiconductor substrate loaded in the first slot. Next, if the detecting unit 122 detects identification information of a second slot, the controlling unit 124 controls the substrate processing unit 130 to process the semiconductor substrate loaded in the second slot in the same manner. For example, a DRAM can be formed using a semiconductor substrate loaded in a second slot of the cassette, the process can be stripping or etching, and the corresponding semiconductor substrate can be formed of silicon (Si).

The substrate processing device 130 processes the semiconductor substrate on the basis of the read control data using the laser beam with an energy corresponding to each of the processes. A detailed construction of the substrate processing device 130 is illustrated in FIG. 4.

Figure 4:
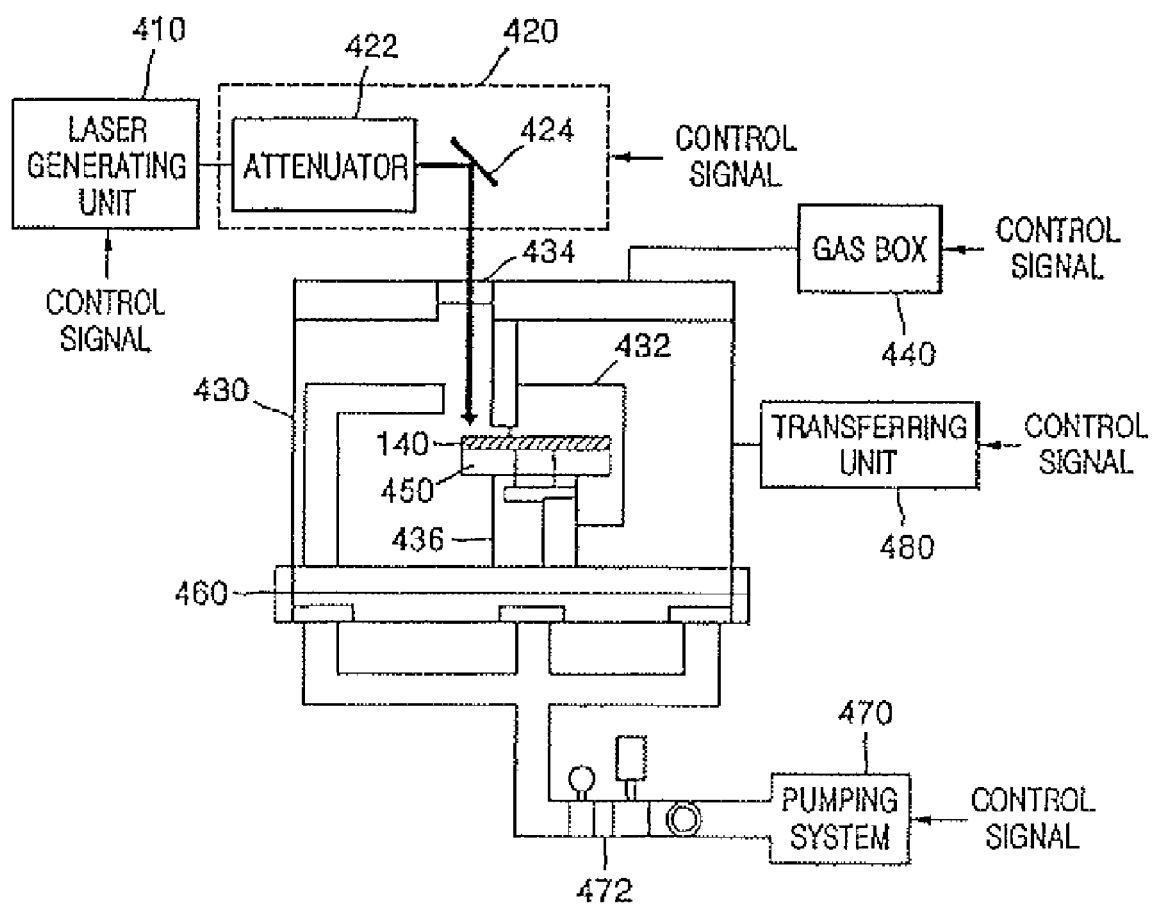
FIG. 4 is a view illustrating a detailed construction of a substrate processing device according to an embodiment of the present invention.

Referring to FIG. 4, the substrate processing device 130 includes a laser generator 410, an optical unit 420, a vacuum chamber 430, a gas box 440, a stage 460, a pumping system 470, and a transferring unit 480.

The laser generator 410 generates the laser beam with the energy corresponding to the control parameter of the laser beam inputted from the process controlling device 120. The energy and the pulse repetition rate of the laser beam emitted from the laser generator 410 are controlled by the control signal outputted from the process controlling device 120. Accordingly, a pulse number of the laser beam irradiated at a specific area of the semiconductor substrate 140 is accurately controlled, together with a movement speed of the stage controlled by the control signal outputted from the process controlling device 120. The generated laser beam has a Gaussian profile. The laser beam has an irregular effect on each area of the semiconductor substrate 140 when the semiconductor substrate 140 is processed. A homogenizer of the optical unit 420 allows the laser beam irradiated on the semiconductor substrate 140 to have a temporarily and spatially regular energy distribution at a specific area of the semiconductor substrate 140. In the above description, the laser generator 410 employs a device for generating a pulse laser beam as an example, but can employ a device for emitting a continuous wave laser beam. The laser beam can include all lasers with photon energy.

The optical unit 420 changes a path of the laser beam, or splits the laser beam, or controls an intensity of the laser beam to irradiate the generated laser beam on the semiconductor substrate 140 seated on a chuck 450 in the vacuum chamber 430.

The optical unit 420 includes an attenuator 422, the homogenizer (not shown), a beam splitter (not shown), a field lens and a doublet lens (not shown), a mirror 424, an energy detector (not shown), a beam profiler (not shown), and the like. The optical unit 420 selectively includes a variety of lenses (not shown). The attenuator 422 controls an amount of the energy of the laser beam emitted from the laser generator 410. The homogenizer regularizes the energy distribution of the laser beam. The homogenizer is installed at a front end of the beam splitter, but can be selectively installed at a rear end of the beam splitter. The beam splitter is selectively provided to split the laser beam such that the laser beam can be irradiated over the chuck 450. The field lens and the doublet lens control the irradiated laser beam to provide a regular beam profile. The mirror 424 changes the path of the laser beam. The energy detector measures the energy of the laser beam irradiated on the process-targeted semiconductor substrate to calculate an energy density of the laser beam. The change of the path and the split and the intensity control of the laser beam, which are accomplished by using the optical unit 420, are controlled by the control parameter inputted from the process controlling device 120.

The vacuum chamber 430 is a place in which the semiconductor substrate 140 is processed. The semiconductor substrate 140 is loaded in the vacuum chamber 430 by the transferring unit 480. The vacuum chamber 430 includes a slit door 432, a quartz window 434, the chuck 450, a support 436, the stage 460, a quartz focus ring (not shown), a pin up and down system (not shown), a Baratron gauge (not shown), and a nozzle (not shown). The slit door 432 opens and closes a path for allowing the entry or advance of the process-targeted semiconductor substrate. The quartz window 434 is manufactured using a quartz having a high transmittance, and allows the laser beam to be irradiated on the process-targeted semiconductor substrate. For convenience of inner washing or management, an upper structure is separated from the vacuum chamber 430 in which the quartz window 434 is disposed.

The stage 460 of the vacuum chamber 430 is differently positioned depending on a scanning way. In a chamber scanning way, a quartz plate and an orifice are provided. The quartz plate functions as a protective wall when the laser beam, which might be irradiated outside of the chuck 450, is irradiated under the chuck 450. The orifice functions to regularly pump the vacuum chamber 430. Unlike the chamber scanning way, a chuck scanning way employs an exhaust tube to more effectively exhaust particles caused when the laser beam is irradiated.

In the chamber scanning way, the stage 460 is installed outside of the vacuum chamber 430 to allow the movement of the whole of the vacuum chamber 430, thereby irradiating the laser beam on the whole of the semiconductor substrate 140. In the chuck scanning way, the stage 460 is disposed in the vacuum chamber 430 to drive the chuck 450 disposed over the stage 460. In the chamber scanning way, there is a feature in that the quartz window 434 on which the laser beam is incident has a size corresponding to a size of the chuck 450 for fixing the semiconductor substrate 140, and the stage 460 for allowing the scanning is disposed under the vacuum chamber 430.

Meanwhile, in the chuck scanning way, the quartz window 434 has a larger size than the laser beam. In the chuck scanning way, the stage 460 is disposed within the vacuum chamber 430. Therefore, the vacuum chamber 430 has a larger size than in the chamber scanning way. Additionally, in order to prevent the generation of a particle source caused by the stage 460 of the vacuum chamber 430, a motor is provided outside of the vacuum chamber 430, and a linear motion guide exposed in the vacuum chamber 430 is shielded using bellows.

The gas box 440 supplies the reactive gas and a purge gas to improve an efficiency of the process of the semiconductor substrate 140. The gas box 440 includes: a Mass Flow Controller (MFC) for controlling a flow of gas introduced into the vacuum chamber 430; an air valve for initiating or blocking a gas introduction into the vacuum chamber 430; a solenoid valve for driving the air valve; a three-way valve for purging a toxic gas; a check valve for preventing a backflow; a filter for preventing the introduction of the particle; a manual valve for manually controlling the opening and closing of the gas; a regulator for regulating a pressure of the gas; and other gas pipes.

The chuck 450 is supported by the stage 460, and the semiconductor substrate 140 is positioned on the chuck 450. The chuck 450 is connected to the stage 460 through a support member 436. The chuck 450 can additionally include a heating unit for heating the semiconductor substrate 140. The stage 460 rotates the semiconductor substrate 140 to allow multi scanning. The stage 460 is disposed within the vacuum chamber 430, and is a module for irradiating the laser beam on the whole surface of the process-targeted semiconductor substrate 140. The laser beam has a size smaller than a diameter of the semiconductor substrate in a width direction, or in both width and length directions. Accordingly, the stage 460 positioned within the vacuum chamber 430 is moved to allow the laser beam to be irradiated on the whole surface of the semiconductor substrate 140 positioned over the stage 460. The stage 460 can be scaled along the X-axis or Y-axis, or can be additionally scaled along the Z-axis if necessary. Further, the stage 460 can be scaled simultaneously along the X and Y-axes. The stage 460 is driven using the motor (not shown).

A quartz focus ring allows the semiconductor substrate 140 to be accurately held, and prevents the laser beam from being irradiated on a heating chuck portion other than the semiconductor substrate. The pin up and down system lifts wafer to allow a robot to easily catch the semiconductor substrate 140 placed on the heating chuck. The Baratron gauge measures a vacuum degree of the vacuum chamber 430. The nozzle initiates or blocks the introduction of the reactive gas and the purge gas. An exhaust port is connected to a pumping system 470 to form a vacuum state in the vacuum chamber 430 or to exhaust particles from the vacuum chamber 430. The nozzle introduces the gas into the vacuum chamber 430. The nozzle is desirably installed adjacently to the process-targeted semiconductor substrate 140 to allow the purge gas or the reactive gas to maintain a regular distribution in an area at which the laser beam is irradiated. Further, if an inert gas is introduced as the purge gas into the vacuum chamber 430 during the processing of the semiconductor substrate 140, the generated particles can be prevented from adhering to the quartz window 434 and the particles can be removed.

The pumping system 470 includes a pumping line 472 acting as a path for exhausting the air from the vacuum chamber 430. The pumping system 470 includes: the exhaust port of the vacuum chamber 430; a check valve for preventing compression; a butterfly valve (throttle valve) for controlling an amount of pumped air; and a gate valve. The gate valve includes a soft valve for allowing a slow pumping; and a roughing valve for allowing a fast pumping. The pumping line 472 is connected to a vacuum pump and the like to form a vacuum in the vacuum chamber 430.

The transferring unit 480 transfers the semiconductor substrate 140 on the chuck 450. That is, the transferring unit 480 supplies the semiconductor substrate 140 loaded in a built-in cassette inside of the vacuum chamber 430, and draws the processed semiconductor substrate 140 outside of the vacuum chamber 430. The transferring unit 480 includes: a cassette stage on which the cassette is put; an aligner for aligning the semiconductor substrate 140; a cooling stage for cooling the semiconductor substrate 140 heated during the process; the robot for transferring the semiconductor substrate 140; and a Fan Filter Unit (FFU) for filtering of particles such as atmosphere dusts. The transferring unit 480 includes a detecting unit 124 for photographing the semiconductor substrate 140 loaded in the cassette to provide photographed image to the controlling unit 122. The detecting unit 124 is desirably disposed at the aligner, but can be disposed in a position of allowing the semiconductor substrate 140 to be photographed in the transferring unit 480.

Each of the structural elements of the substrate processing device 130 is controlled by the control signal inputted from the process controlling device 120. The process controlling device 120 reads the control data, which corresponds to the identification information of the slot, from the storing device 110, and provides the control signal corresponding to the read control data to each of the structural elements of the substrate processing device 130.

Alternatively, unlike the description of FIG. 4, the substrate processing device 130 can have a structure where the chamber is not provided. In this case, the structural elements such as the vacuum chamber 430, the gas box 440, the pumping system 470 and the like for preparing a vacuum atmosphere or a gas atmosphere are not installed. However, the laser generator 410, the optical unit 420, the chuck 450, the stage 460 and the transferring unit 480 should be necessarily provided to process the semiconductor substrate 140. Further, the nozzle should be necessarily provided to inject the inert gas into the vacuum chamber 430, and a hood should be necessarily provided to exhaust the particles and the inert gas from the vacuum chamber 430 after the laser treatment.

Figure 5:
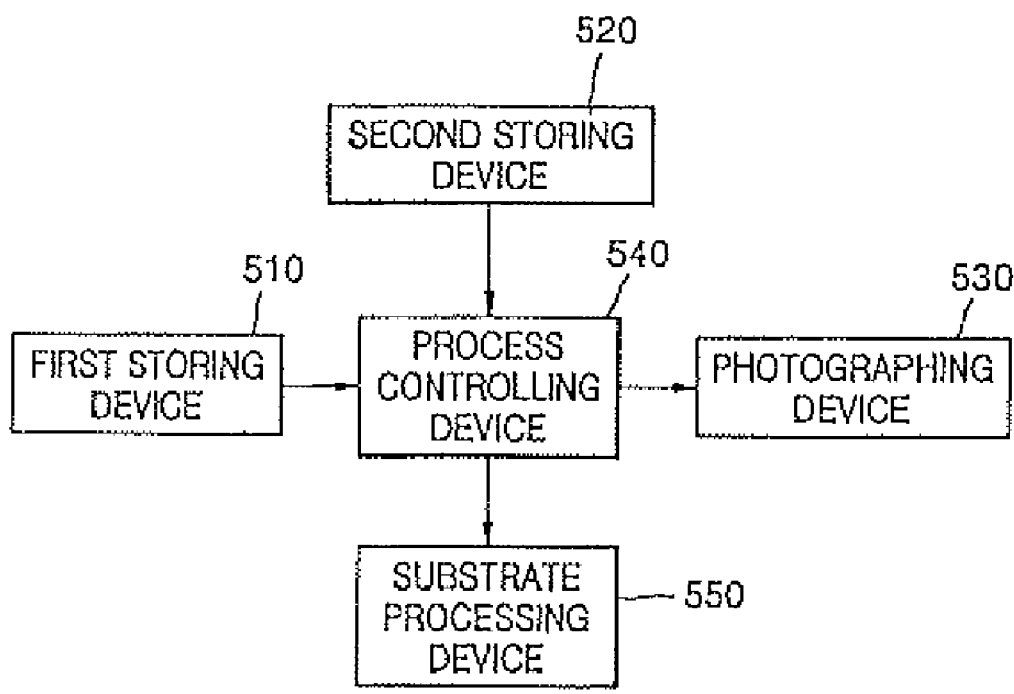
FIG. 5 is a block diagram illustrating a detailed construction of a substrate processing device according to another embodiment of the present invention.

FIG. 5 is a block diagram illustrating a detailed construction of a substrate processing system using a laser, according to another embodiment of the present invention.

Referring to FIG. 5, the semiconductor substrate processing system includes a first storing device 510, a second storing device 520, a photographing device 530, a process controlling device 540, and a substrate processing device 550. Since the first storing device 510 and the substrate processing device 550 have the same construction and function as the storing device 110 and the substrate processing device 130 described with reference to FIG. 1, the detailed descriptions thereof are omitted.

The second storing device 520 stores image data during each process of the semiconductor substrate 140. The image data are reference images previously photographed corresponding to the device formed in the semiconductor substrate 140, the material of the semiconductor substrate 140, and the process performed for the semiconductor substrate 140.

The photographing device 530 is provided at the aligner for aligning the semiconductor substrate 140 loaded in a plurality of slots of the cassette. The photographing device 530 is embodied using a photoelectric conversion device for converting light, which is emitted from the semiconductor substrate 140, into an electrical signal. The photographed image is inputted to the process controlling device 540.

Figure 6:
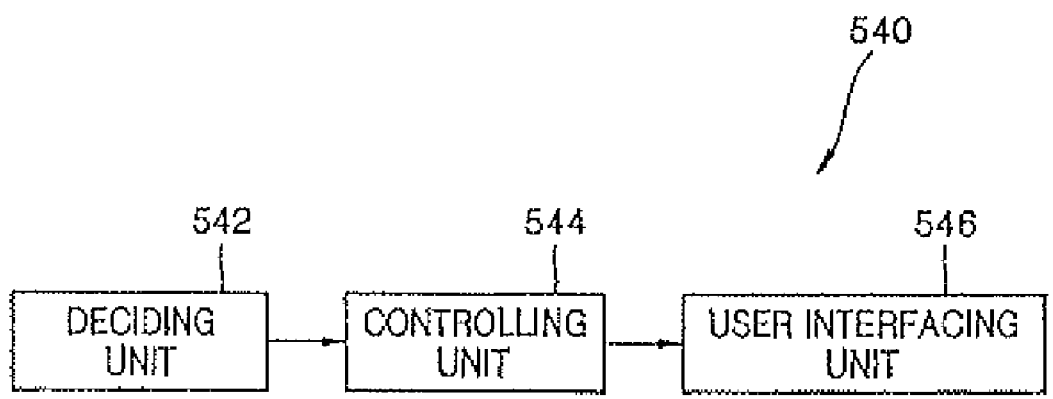
FIG. 6 is a block diagram illustrating a detailed construction of a process controlling device according to another embodiment of the present invention.

FIG. 6 is a block diagram illustrating a detailed construction of the process controlling device 540 according to another embodiment of the present invention.

Referring to FIG. 6, the process controlling device 540 includes a deciding unit 542, a controlling unit 544, and a user interfacing unit 546. The deciding unit 542 compares a pattern, which is recognized from the photographed image inputted from the photographing device 530, of the semiconductor substrate 140 with a pattern of the image data stored in the second storing device 520, to decide the process of the semiconductor substrate 140.

The controlling unit 544 reads the control data, which corresponds to the process decided for the semiconductor substrate 140, from the first storing device 510, and controls the process of the semiconductor substrate 140 by the read control data. The control signal outputted from the controlling unit 544 is inputted to the substrate processing device 550.

The user interfacing unit 546 receives the control data stored in the first storing device 510 or receives the image data stored in the second storing device 520 from the user. The controlling unit 544 stores the control data or the image data received through the user interfacing unit 546 in the first storing device 510 or the second storing device 520.

Figure 7:
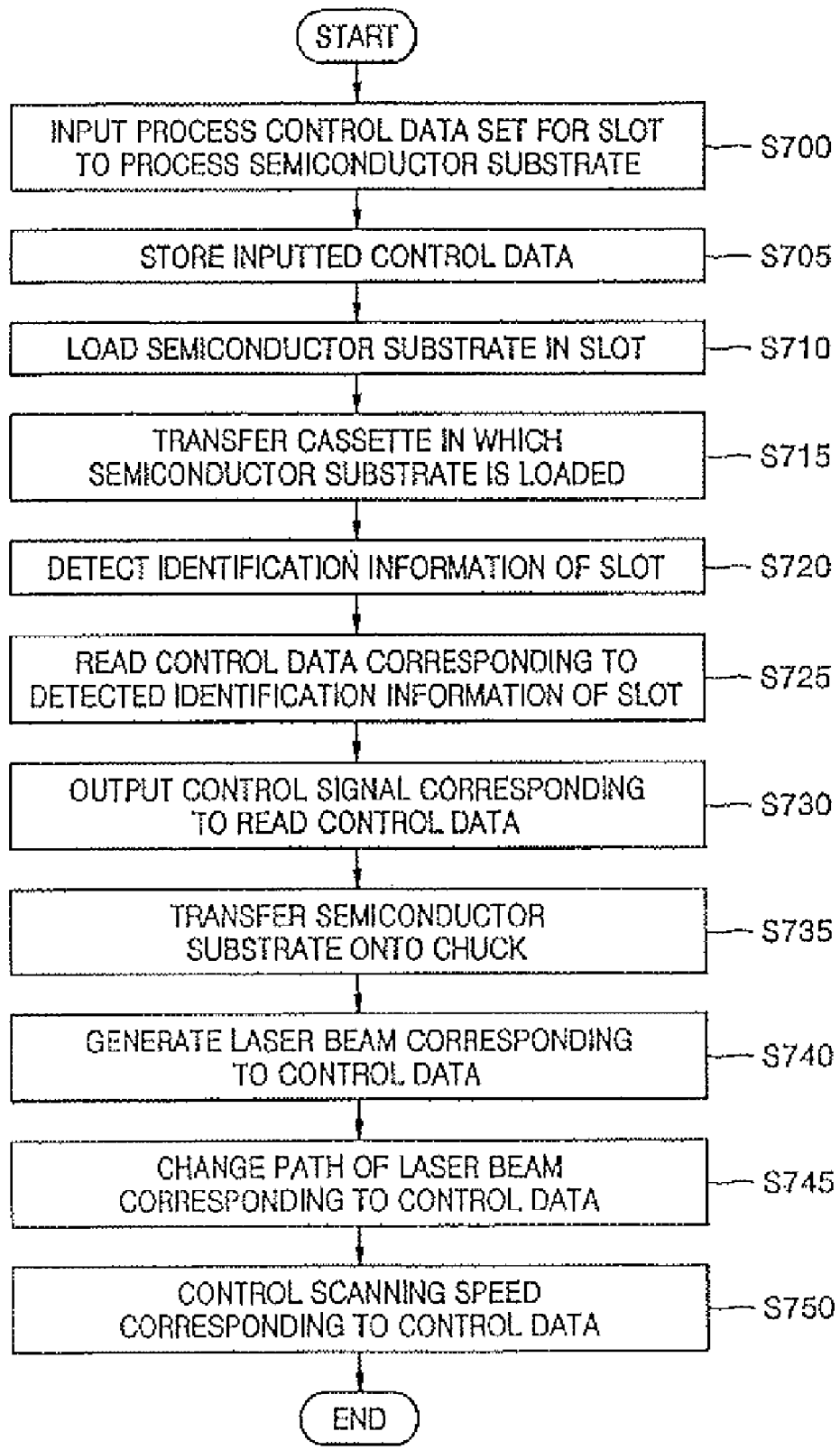
FIG. 7 is a flowchart illustrating a method for processing a semiconductor substrate by using a laser, according to an embodiment of the present invention.

FIG. 7 is a flowchart illustrating a method for processing a semiconductor substrate by using a laser according to an embodiment of the present invention.

Referring to FIG. 7, the user inputs the set control data to the storing device 110 through the user interfacing unit 126 to process the semiconductor substrate 140 (S700). The inputted control data is stored in the storing device 110 (S705). Next, the semiconductor substrate 140 is loaded in the slot of the cassette. The proper identification information is attached or printed at each of the slots in an electrically or electronically recognizable format (for example, a barcode, an identification card and the like). Furthermore, visually recognizable process information, information on the kind of the device formed in the semiconductor substrate and the kind of the material constituting the semiconductor substrate, and the like can be recorded in the slot correspondingly to the identification information of each of the slots.

The transferring unit 480 transfers the cassette in which the semiconductor substrate 140 is loaded to the stage 460. If the cassette is spaced apart from the stage 460 and reaches at a position of detecting the identification information, the detecting unit 122 of the aligner detects the identification information of the slot (S720). The identification information detected by the detecting unit 122 is inputted to the controlling unit 124. The controlling unit 124 reads the control data, which is set for the detected identification information, from the storing device 110 (S725). After that, the controlling unit 124 outputs the control signal corresponding to the read control data to the substrate processing device 130 (S730).

If the cassette is spaced apart from the stage 460 and reaches a position when the substrate is detached, the transferring unit 480 detaches the semiconductor substrate 140 from the slot to transfer the semiconductor substrate 140 onto the chuck 450 (S735). The laser generator 410 generates the laser beam, which has the energy, the pulse number, the repetition rate, the pulse width and the like corresponding to the process of the transferred semiconductor substrate 140 (S740). The optical unit 420 performs a light split, a light path change, an attenuation angle setting and the like corresponding to the process of the transferred semiconductor substrate 140 to allow the generated laser beam to be irradiated on the semiconductor substrate 140 (S745). The chuck 450 or the stage 460 is driven at the scanning speed corresponding to the process of the transferred semiconductor substrate 140 (S750). The above procedure is repetitively performed for the semiconductor substrate 140 loaded in each of the slots.

Figure 8:
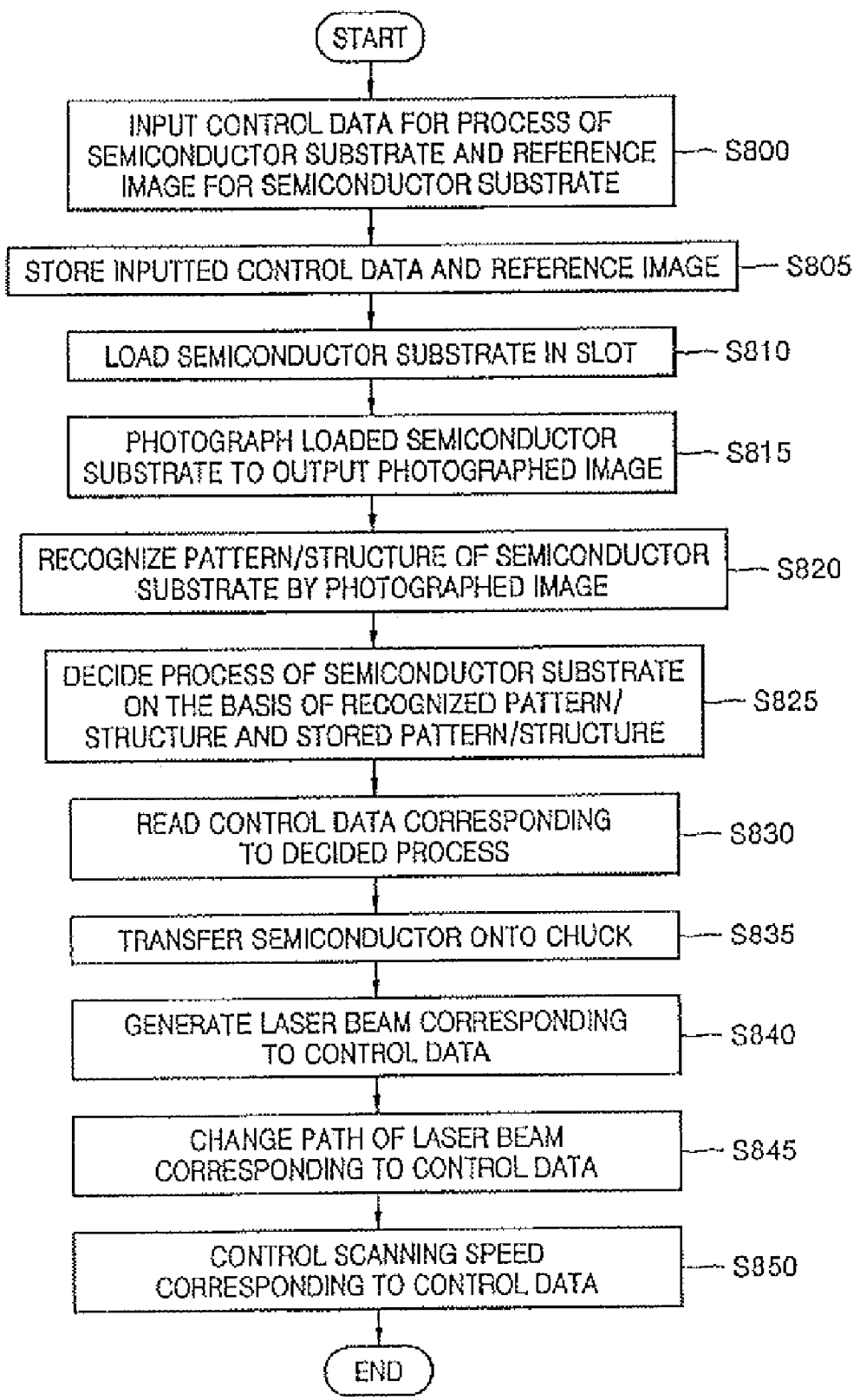
FIG. 8 is a flowchart illustrating a method for processing a semiconductor substrate by using a laser, according to another embodiment of the present invention.

FIG. 8 is a flowchart illustrating a method for processing a semiconductor substrate using a laser according to another embodiment of the present invention.

Referring to FIG. 8, through the user interfacing unit 126, the user inputs the control data for the process of the semiconductor substrate 140 and the reference image previously photographed corresponding to the device formed in the semiconductor substrate 140, the material of the semiconductor substrate 140, and the process of the semiconductor substrate 140 (S800). The inputted control data and reference image is respectively stored in the first storing device 510 and the second storing device 520 (S805). Next, the semiconductor substrate 140 is loaded in the slot of the cassette (S810). After that, the photographing device 530 photographs the semiconductor substrate 140 loaded in each of the slots to provide the photographed image of the semiconductor substrate 140 to the process controlling device 540 (S815).

The deciding unit 542 recognizes the pattern of the semiconductor substrate 140 through the inputted photographed image (S820). Next, the deciding unit 542 compares the recognized pattern with the pattern of the stored image data to decide the process of the semiconductor substrate 140. The controlling unit 544 reads the control data, which corresponds to the decided process of the semiconductor substrate 140, from the substrate processing device 550 (S830).

If the cassette is spaced apart from the stage 460 and reaches the position the substrate is detached, the transferring unit 480 detaches the semiconductor substrate 140 from the slot to transfer the detached semiconductor substrate 140 onto the chuck 450 (S835). The laser generator 410 generates the laser beam with the energy, the pulse number, the repetition rate, the pulse width and the like corresponding to the process of the transferred semiconductor substrate 140 (S480). The optical unit 420 performs the light split, the light path change, the setting of the attenuation angle and the like corresponding to the process of the transferred semiconductor substrate 140 to allow the generated laser beam to be irradiated on the semiconductor substrate 140 (S845). The chuck 450 or the stage 460 is driven at the scanning speed corresponding to the process of the transferred semiconductor substrate 140 (S850). The above procedure is repetitively performed for the semiconductor substrate 140 loaded in each of the slots.

Meanwhile, in case where the vacuum chamber 430, the gas box 440 and the pumping system 470 are provided in the substrate processing device 130, they are controlled by the control signal inputted from the controlling unit 124 to prepare the vacuum atmosphere or the gas atmosphere in the vacuum chamber 430.

Hereinafter, the system and method for processing a semiconductor substrate by using a laser according to the present invention is applied to provide experimental results for the cleaning, stripping, polishing and annealing processes. The laser used in the experiment is a KrF excimer laser having a laser pulse length of 23 ns. The experiment is performed on the basis of the pulse number, the pulse repetition rate, the atmosphere and the like.

First, an experimental result of a procedure of removing particles from a photomask using the laser is provided.

The photomask is a pattern to be formed on a wafer. The pattern is formed of a Cr-based or MoSi-based material for the purpose of an exposure process to have the same shape on a transparent substrate of a quartz material. The particles are generated during the process of forming the pattern of the material deposited on the quartz substrate. The particles directly influence device reliability, and should be necessarily removed. The photomask for this experiment has a size of six inches in length and width. Cr film and MoSiON film are patterned as the shield film. The particles are adhered to the shield film after the pattern is formed. The adhered particles are removed using the laser. KLA-Tencor equipment is used to measure a result of removal.

Table 1 shows an experimental result according to a variety of variables of the laser. As shown in Table 1, when the Cr film is respectively given three pulses and ten pulses at laser energy densities of 100 mJ/cm$^2$ and 90 mJ/cm$^2$, the particles can be removed from the Cr film without damage. Additionally, when the MoSiON film is respectively given ten pulses at laser energy densities of 100 mJ/cm$^2$, 120 mJ/cm$^2$ and 140 mJ/cm$^2$, the particles can be removed from the MoSiON film without damaging the film.

TABLE 1

| Class | Shield film | Energy density (mJ/cm$^2$) | Number of laser pulses | Experiment result |
|---|---|---|---|---|
| 1 | Cr | 100 | 5 | Shield film damaged |
| 2 | Cr | 100 | 3 | No damage, good removal |
| 3 | Cr | 90 | 10 | No damage, good removal |
| 4 | Cr | 80 | 15 | Bad removal |
| 5 | MoSiON | 100 | 10 | No damage, good removal |
| 6 | MoSiON | 120 | 10 | No damage, good removal |
| 7 | MoSiON | 140 | 10 | No damage, good removal |
| 8 | MoSiON | 150 | 10 | Shield film damaged |
| 9 | MoSiON | 150 | 30 | Shield film damaged |
| 10 | MoSiON | 160 | 10 | Shield film damaged |

Next, an experiment result of a process of removing a photoresist and a polymer after the storage node is etched during a DRAM process using the laser is provided.

During the DRAM process, after ruthenium (Ru) is etched, the photoresist and the polymer exist within a hole. Herein, the polymer is a metallic polymer and is not easily removed, and has a great influence on a device characteristic. A sample of the storage node used in this experiment has a Critical Dimension (CD) of 0.25 μm and a depth of 0.5 μm. Additionally, the sample includes the photoresist and the polymer. The laser is used to concurrently remove the photoresist and the polymer from the sample. Secondary Electron Microscopy (SEM) equipment is used to measure a result of removal. The measured result is shown in Table 2. Referring to Table 2, when three pulses are given at a laser energy density of 130 mJ/cm$^2$, the photoresist and the polymer are concurrently removed without damaging a ruthenium (Ru) film.

TABLE 2

| | Energy density (mJ/cm$^2$) | Number of laser pulses | Experiment result | | |
|---|---|---|---|---|---|
| Class | | | Ru damage | PR removal | Polymer removal |
| 1 | 90 | 3 | No | No removal | No removal |
| 2 | 90 | 5 | No | Removed | No removal |
| 3 | 130 | 3 | No | Removed | Removed |
| 4 | 130 | 5 | Damaged | Removed | Removed |
| 5 | 140 | 2 | No | No removal | No removal |
| 6 | 140 | 3 | Damaged | Removed | Removed |
| 7 | 150 | 2 | Damaged | Removed | Removed |
| 8 | 150 | 3 | Damaged | Removed | Removed |

Next, an experimental result of a process of polishing a LiTaO$_3$ substrate using the laser is provided.

The LiTaO$_3$ substrate is used for the RF device and the like. After the etching process of manufacturing the device, the over-etching of the LiTaO$_3$ substrate causes a line-patterned fault and also damages a surface of the LiTaO$_3$ substrate in roughness. These cause a device failure. In this experiment, the LiTaO$_3$ substrate employs a wafer of four inches. The LiTaO$_3$ substrate has the line-patterned fault, and has the surface roughness of about 500 Å in Rp-v and about 50 Å in RMS. The laser is used to planarize the sample, and Atomic Force Microscopy (AFM) equipment is used to measure a result of planarization. The result is shown in Table 3. Referring to Table 3, when ten pulses, fifteen pulses, and twenty pulses are respectively given at a laser energy density of 150 mJ/cm$^2$, a minute degree of planarization is improved.

TABLE 3

| Class | Energy density (mJ/cm$^2$) | Number of laser pulses | Experiment result Rp-v(Å) | RMS(Å) |
|---|---|---|---|---|
| 1 | 150 | 10 | 199 | 3.12 |
| 2 | 150 | 15 | 28.2 | 1.75 |
| 3 | 150 | 20 | 12 | 1.49 |
| 4 | 150 | 30 | Substrate damaged | |
| 5 | 155 | 10 | 102 | 2.47 |
| 6 | 160 | 10 | Substrate damaged | |

Next, an experimental result of a process of annealing GaN using the laser is provided.

GaN is intensively studied for applications to Laser Diodes (LD) or blue Light Emitting Diodes (LED). GaN is deposited on the quartz (SiO$_2$) as a polycrystalline material. When photoluminescence (PL) is measured, the deposited polycrystalline GaN is observed as not only having a Band-edge Emission (BE) peak (about 3.4 eV) corresponding to a bandgap of the GaN, but also having a Quasi-level peak (replica) caused by exciton or phonon, and a variety of peaks caused by an impurity level and the like. Yellow emission (YL) peak (about 2.2 eV) resulted from a grain boundary acts as a main cause of reducing an optical efficiency. Accordingly, in order to improve a characteristic of the polycrystalline GaN, an unnecessary Quasi-level peak should be removed through the annealing, and the yellow emission peak should be removed through a grain growth.

In this experiment, the characteristic of the polycrystalline GaN is improved by annealing using the laser. PL equipment is used to measure a result of improvement. The experiment result is shown in Table 4. Referring to Table 4, when one hundred laser pulses and two hundreds laser pulses are irradiated at laser energy densities of 400 mJ/cm$^2$ and 450 mJ/cm$^2$, the unnecessary peaks are removed. Even when one hundred laser pulses are irradiated at a laser energy density of 500 mJ/cm$^2$, an improvement effect is also obtained.

TABLE 4

| Class | Energy density (mJ/cm$^2$) | Number of laser pulses | Experiment result |
| --- | --- | --- | --- |
| 1 | 350 | 50 | No effect |
| 2 | 350 | 100 | No effect |
| 3 | 350 | 200 | No effect |
| 4 | 350 | 300 | No effect |
| 5 | 400 | 50 | No effect |
| 6 | 400 | 100 | Improved |
| 7 | 400 | 200 | Improved |
| 8 | 400 | 300 | GaN damaged |
| 9 | 450 | 50 | No effect |
| 10 | 450 | 100 | Improved |
| 11 | 450 | 200 | Improved |
| 12 | 450 | 300 | GaN damaged |
| 13 | 500 | 50 | No effect |
| 14 | 500 | 100 | Improved |
| 15 | 500 | 200 | GaN damaged |
| 16 | 600 | 50 | GaN damaged |

In this experiment, different samples are respectively used for the different process. Each of the samples is different in recipe. This experiment result corresponds to one embodiment of the present invention. The recipe for each of the processes for a variety of devices can employ the laser. The recipe is stored in a database and used to control a manufacture process of the semiconductor substrate. Additionally, the semiconductor substrates in this experiment are different in shape or size. According to the present invention, a database of the recipe can be not only constructed for the different kind of the sample requiring the different process to easily process the semiconductor substrate in one apparatus, but also the samples having a different size or shape can be processed using hardware and software.

Alternatively, the used laser beam of the present invention has desirably a line shape, but can have a different shape (for example, rectangular beam). At this time, the rectangular beam is much smaller than the process-targeted semiconductor substrate. Therefore, the scanning is severally performed to process the whole wafer. The rectangular beam has an advantage in that since the laser beam is short, an optical system does not need a large-sized lens. Accordingly, even the quartz window 434 is small, and even the exhaust port adjacent to the wafer is small.

In this case, since the scanning is severally performed to process the whole of the process-targeted semiconductor substrate, the laser beam should be accurately controlled at its lengthwise superposed and irradiated portion. Accordingly, in order to accurately control the superposed and irradiated portion of the laser beam, the stage needs to be driven with a great degree of accuracy. Further, in case where such a laser beam is employed, the stage can be driven step by step, to irradiate the laser beam on the semiconductor substrate.

In this case, the size of the laser beam is controlled and the laser beam is irradiated to a specific area of the semiconductor substrate from which one or more chips can be made. At this time, the process-targeted semiconductor substrate is processed in such a manner that the laser beam is irradiated on the specific area of the semiconductor substrate. After the semiconductor substrate is moved at a predetermined distance, the laser beam is irradiated on a next specific area of the moved semiconductor substrate. As such, a good efficiency is obtained since the laser beam is efficiently not irradiated. Further, unlike the scanning way, the step by step motion superposes less the laser beam in a width direction, not in a length direction. Besides, the laser beam is superposed to prevent a problem at the time of the completion of the chip. Accordingly, a problem of the scanning way, that is, superposition, is solved. However, in the step by step motion, information and mapping for the semiconductor substrate at which the chip is manufactured should be preceded. Furthermore, the accurate driving of the stage is required.

The present invention relates to a system and method for processing a semiconductor substrate using a laser, but those skilled in the art can understand that other device than a semiconductor substrate can be processed within the scope and spirit of the present invention.

When the process is performed using a laser according to the present invention, the irradiated laser has an energy level not to damage the semiconductor substrate, to remove particles. Alternatively, when the process is performed using the laser, the laser beam has an energy level enough to change a physicochemical characteristic of the semiconductor substrate other than the removal-targeted substance. Accordingly, the removal of the particles and the characteristic improvement of the semiconductor substrate are concurrently accomplished. For example, the laser beam having enough energy is used to concurrently perform stripping and annealing after a planarization process. At this time, the laser beam should have an energy level not to damage the semiconductor substrate, remove the particles, and improve the characteristic of the semiconductor substrate.

Through this method, melting, annealing, and ablation of a semiconductor substrate are performed to improve a crystal structure, a density, conductivity, and the like. Further, by irradiating the laser beam having an energy level larger than the energy necessary for removing a particle, the process-targeted substance can be removed. At the same time, the number of the laser pulses can be reduced. The number of the laser pulses has a close relation with the efficiency of removal. Furthermore, an unstable structure of the semiconductor substrate, which is disposed under the process-targeted substance, can be stabilized. At the same time, the surface roughness using a method such as the melting can be improved, thereby providing two or more improvements through one process.

According to the present invention, the semiconductor substrate is processed by the control data for the process decided on the basis of the slot or the image of the semiconductor substrate. Therefore, a new process, or a reset process of a semiconductor manufacturing device is not required when the semiconductor substrate having a different characteristic from a conventional semiconductor substrate is processed. Accordingly, the present invention can process the semiconductor substrate using a variety of characteristics and a variety of processes in one substrate processing system. Further, the exhaust port connected with one pumping system is disposed at each of the chucks disposed within the vacuum chamber, thereby preventing the particles from contaminating the quartz window.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A system for processing a semiconductor substrate using a laser beam, the system comprising:
   a first storing unit storing a process control data set for the semiconductor substrate;
   a second storing unit storing image data of each of processes of the semiconductor substrate;
   a photographing unit photographing the semiconductor substrate to output a photographed image of the semiconductor substrate;
   a process controlling unit comparing the outputted photographed image and the stored image data to decide the process of the semiconductor substrate, and reading the control data corresponding to the decided process from the first storing unit to control the process of the semiconductor substrate; and
   a substrate processing unit processing the semiconductor substrate on the basis of the read control data using the laser beam with a predetermined energy.

2. The system of claim 1, wherein the process controlling unit comprises:
   a deciding unit comparing a pattern formed on the semiconductor substrate and a pattern of the stored image data on the basis of the photographed image to decide the process of the semiconductor substrate; and
   a controlling unit reading the control data corresponding to the decided process from the first storing unit, and controlling the process of the semiconductor substrate on the basis of the read control data.

3. The system of claim 1, wherein the process controlling unit further comprises a user interfacing unit receiving the stored control data or receiving the stored image data from a user.

4. The system of claim 1, wherein the photographing unit is provided at an aligner aligning the semiconductor substrates loaded in a plurality of slots provided at a cassette.

5. The system of claim 1, wherein the photographing unit comprises a photoelectric conversion unit converting a light emitted from the semiconductor substrate into a predetermined electrical signal.

6. The system of claim 1, wherein the control data has at least one of a control parameter, a scanning speed, a repetition rate, an attenuation angle of the laser beam, a kind of a reactive gas, and an injection speed of the reactive gas, which correspond to the process of the semiconductor substrate.

7. The system of claim 6, wherein the process of the semiconductor substrate comprises a first process including at least one of etching, ion-implantation, planarization, and deposition, and a second process including at least one of stripping, polishing, cleaning, and annealing corresponding to the first process.

8. The system of claim 1, wherein the control data has at least one of a control parameter, a scanning speed, a repetition rate, an attenuation angle of the laser beam, a kind of a reactive gas, an injection speed of the reactive gas, which correspond to a kind of a device formed in the semiconductor substrate or a kind of material constituting the semiconductor substrate.

9. The system of claim 8, wherein the device is at least one of a memory device, a non-memory device, a RF (Radio Frequency) device, and a displaying device.

10. The system of claim 1, wherein the substrate processing unit comprises:
    a laser generating unit generating the laser beam;
    an optical unit transmitting the laser beam to the semiconductor substrate;
    a chuck holding the semiconductor substrate thereon; and
    a transferring unit transferring the semiconductor substrate from the cassette in which the semiconductor substrate is loaded to the chuck.

11. The system of claim 10, wherein the substrate processing unit further comprises:
    a vacuum chamber providing a vacuum atmosphere or a gas atmosphere to process the semiconductor substrates loaded therein;
    a gas box storing a reactive gas or a purge gas, which is introduced into the vacuum chamber to prepare the gas atmosphere; and
    a pumping system having a pumping line exhausting the reactive gas or the purge gas from the vacuum chamber.

12. The system of claim 10, wherein the substrate processing unit further comprises a stage driven by a driving a motor, to allow the laser beam to be irradiated on an entire surface of the semiconductor substrate.

13. The system of claim 10, wherein the substrate processing unit further comprises the stage supporting the chuck, whereby the chuck supported by the stage is driven to allow the laser beam to be irradiated on the entire surface of the semiconductor substrate.

14. The system of claim 10, wherein the optical unit comprises:
    an attenuator controlling an energy level of the laser beam outputted from the laser generating unit;
    a homogenizer regularizing an energy distribution of the laser beam;
    a lens array having a field lens and a doublet lens controlling the irradiated laser beam to have a regular beam profile; and
    a mirror changing a path of the laser beam to be irradiated on the semiconductor substrate.

15. The system of claim 10, wherein the transferring unit comprises:
    the cassette having the plurality of slots in which the semiconductor substrate are loaded;
    an aligner aligning the semiconductor substrate loaded in the slots of the cassette;
    a cooling stage cooling the semiconductor substrate heated; and
    a transferring robot transferring the loaded semiconductor substrate from the slots to the chuck.

16. The system of claim 10, wherein the photographing unit is provided at the transferring unit.

17. The system of claim 10, wherein the laser generating unit generates the laser beam having an energy larger than an energy necessary for removing particles from the semiconductor substrate.

18. A method for processing a semiconductor substrate using a laser beam, the method comprising:
    setting a process control data set for the semiconductor substrate;
    storing image data of each process of the semiconductor substrate;
    photographing the semiconductor substrate to output a photographed image;
    comparing the outputted photographed image and the stored image data to decide the process of the semiconductor substrate;

controlling the process of the semiconductor substrate on the basis of the control data corresponding to the decided process; and processing the semiconductor substrate on the basis of the control data using the laser beam with a predetermined energy.

19. The method of claim 18, wherein in the deciding of the process, a pattern formed on the semiconductor substrate is compared with a pattern of the stored image data on the basis of the photographed image to decide the process of the semiconductor substrate.

20. The method of claim 18, wherein the photographing is performed using the photographing unit of the aligner aligning the semiconductor substrates, which are loaded in a plurality of slots provided at a cassette, or using the transferring unit transferring the semiconductor substrate.

21. The method of claim 18, wherein the photographing further comprises converting a light, which is emitted from the semiconductor substrate, into a predetermined electrical signal.

22. The method of claim 18, wherein the control data has at least one of a control parameter, a scanning speed, a repetition rate, an attenuation angle of the laser beam, a kind of a reactive gas, and an injection speed of the reactive gas, which correspond to the process of the semiconductor substrate.

23. The method of claim 22, wherein the processing of the semiconductor substrate comprises a first process including at least one of etching, ion-implantation, planarization and deposition, and a second process including at least one of stripping, polishing, cleaning and annealing, which correspond to the first process.

24. The method of claim 18, wherein the control data has at least one of a control parameter, a scanning speed, a repetition rate, an attenuation angle of the laser beam, a kind of the reactive gas, and an injection speed of the reactive gas, which correspond to a kind of a device formed in the semiconductor substrate or a kind of material constituting the semiconductor substrate.

25. The method of claim 24, wherein the device is at least one of a memory device, a non-memory device, a RF (Radio Frequency) device and a displaying device.

26. The method of claim 18, wherein the processing of the semiconductor substrate comprises:

transferring the semiconductor substrate from a cassette in which the semiconductor substrate is loaded, to a heating chuck; and transmitting the generated laser beam from a laser generator to the semiconductor substrate.

27. The method of claim 26, wherein the processing of the semiconductor substrate further comprises preparing a vacuum atmosphere or a gas atmosphere to allow the loaded semiconductor substrates to be processed in the vacuum chamber.

28. The method of claim 26, wherein the processing of the semiconductor substrate further comprises driving the vacuum chamber into which the semiconductor substrate is introduced, to allow the laser beam to be irradiated on an entire surface of the semiconductor substrate.

29. The method of claim 26, wherein the processing of the semiconductor substrate further comprises driving the chuck on which the semiconductor substrate is loaded, to allow the laser beam to be irradiated on the entire surface of the semiconductor substrate.

30. The method of claim 18, wherein the generated laser beam has a larger energy than an energy necessary for removing particles from the semiconductor substrate.

* * * * *